(12) United States Patent
Shinohara et al.

(10) Patent No.: US 10,475,638 B2
(45) Date of Patent: Nov. 12, 2019

(54) SUBSTRATE PROCESSING APPARATUS, SUBSTRATE PROCESSING METHOD, AND COMPUTER-READABLE RECORDING MEDIUM HAVING STORED THEREON SUBSTRATE PROCESSING PROGRAM

(71) Applicant: Tokyo Electron Limited, Tokyo (JP)

(72) Inventors: Kazuyoshi Shinohara, Koshi (JP); Yuki Yoshida, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 281 days.

(21) Appl. No.: 15/307,427

(22) PCT Filed: May 1, 2015

(86) PCT No.: PCT/JP2015/063091
§ 371 (c)(1),
(2) Date: Oct. 28, 2016

(87) PCT Pub. No.: WO2015/167012
PCT Pub. Date: Nov. 5, 2015

(65) Prior Publication Data
US 2017/0047219 A1    Feb. 16, 2017

(30) Foreign Application Priority Data

May 1, 2014  (JP) .................................. 2014-094640

(51) Int. Cl.
*B08B 3/02*   (2006.01)
*H01L 21/02*  (2006.01)
(Continued)

(52) U.S. Cl.
CPC ........ *H01L 21/02052* (2013.01); *B08B 3/024* (2013.01); *B08B 3/08* (2013.01);
(Continued)

(58) Field of Classification Search
CPC ......... H01L 21/02052; H01L 21/67028; H01L 21/6704; H01L 21/67051; B08B 3/024; B08B 3/08; F26B 15/04; F26B 21/004
See application file for complete search history.

(56) References Cited

U.S. PATENT DOCUMENTS

| 5,882,433 A | 3/1999 | Ueno |
| 2007/0017555 A1* | 1/2007 | Sekiguchi ................. B08B 3/02 134/33 |

(Continued)

FOREIGN PATENT DOCUMENTS

| JP | 09-038595 A | 2/1997 |
| JP | 2007-220956 A | 8/2007 |

(Continued)

OTHER PUBLICATIONS

International Search Report for PCT/JP2015/063091 dated Jun. 16, 2015.

*Primary Examiner* — Sharidan Carrillo
(74) *Attorney, Agent, or Firm* — Pearne & Gordon LLP (57) ABSTRACT

A substrate processing apparatus includes a substrate rotating unit 11 configured to hold and rotate a substrate 3; a processing liquid supplying unit 13 configured to supply a processing liquid to the substrate; and a replacement liquid supplying unit 14 configured to supply, to the substrate, a replacement liquid with which the processing liquid supplied from the processing liquid supplying unit is replaced. While the replacement liquid supplying unit 14 supplies the replacement liquid to the substrate, the processing liquid supplying unit 13 supplies the processing liquid to a position on the substrate positioned at an outer peripheral side thereof than a supply position of the replacement liquid to form a liquid film of the processing liquid. It is possible to maintain a state in which the entire surface of the substrate is covered (Continued)

with the liquid film without increasing consumption amount of the replacement liquid.

5 Claims, 8 Drawing Sheets

(51) Int. Cl.
- *B08B 3/08* (2006.01)
- *H01L 21/67* (2006.01)
- *F26B 21/00* (2006.01)
- *F26B 15/04* (2006.01)

(52) U.S. Cl.
CPC ............ *F26B 15/04* (2013.01); *F26B 21/004* (2013.01); *H01L 21/6704* (2013.01); *H01L 21/67028* (2013.01); *H01L 21/67051* (2013.01)

(56) References Cited

U.S. PATENT DOCUMENTS

| | | | |
|---|---|---|---|
| 2007/0223342 A1* | 9/2007 | Orii | H01L 21/02052 369/69 |
| 2012/0260952 A1* | 10/2012 | Nonaka | H01L 21/02052 134/30 |
| 2013/0174873 A1 | 7/2013 | Yoshihara | |
| 2014/0360536 A1* | 12/2014 | Kawabuchi | H01L 21/6715 134/33 |
| 2017/0047219 A1* | 2/2017 | Shinohara | B08B 3/024 |

FOREIGN PATENT DOCUMENTS

| | | |
|---|---|---|
| JP | 2010-045389 A | 2/2010 |
| JP | 2011-009601 A | 1/2011 |
| JP | 2013-140881 A | 7/2013 |

* cited by examiner

SUBSTRATE PROCESSING APPARATUS, SUBSTRATE PROCESSING METHOD, AND COMPUTER-READABLE RECORDING MEDIUM HAVING STORED THEREON SUBSTRATE PROCESSING PROGRAM

CROSS-REFERENCE TO RELATED APPLICATION

This Application is a U.S. national phase application under 35 U.S.C. § 371 of PCT Application No. PCT/JP2015/063091 filed on May 1,2015, which claims the benefit of Japanese Patent Application No. 2014-094640 filed on May 1, 2014, the entire disclosures of which are incorporated herein by reference.

TECHNICAL FIELD

The various embodiments described herein pertain generally to a substrate processing apparatus and a substrate processing method for replacing a processing liquid on a substrate with a replacement liquid, and also pertain to a computer-readable recording medium having stored thereon a computer-executable substrate processing program.

BACKGROUND ART

Conventionally, when manufacturing a semiconductor component, a flat panel display, or the like, various liquid processings such as cleaning or etching are performed on a substrate such as a semiconductor wafer or a liquid crystal substrate by using a substrate processing apparatus.

For example, in a substrate processing apparatus configured to perform cleaning of a substrate, a chemical liquid for cleaning is supplied to the substrate which is being rotated, and a surface of the substrate is cleaned with the chemical liquid. Then, a rinse liquid is supplied to a central portion of the substrate, and the surface of the substrate is rinsed with the rinse liquid. In this rinsing process, by supplying a processing liquid (e.g., pure water) for rinsing the surface of the substrate to the substrate, a liquid film of the processing liquid is formed on the surface of the substrate. Thereafter, the supply of the processing liquid is stopped, and by supplying a drying solution (e.g., IPA (isopropyl alcohol)) having a higher volatility than the processing liquid to the central portion of the substrate, a replacement process of replacing the liquid film of the processing liquid formed on the surface of the substrate with the drying solution is performed. In this replacement process, a liquid film of the drying solution is formed on the surface of the substrate as the processing liquid is replaced by the drying solution, starting from the central portion of the substrate toward an outer peripheral side thereof. Afterwards, an inert gas (e.g., nitrogen gas) is discharged toward the drying solution, and by dispersing the drying solution outwards from the surface of the substrate with a centrifugal force which is generated as the substrate is rotated, the surface of the substrate is dried.

As stated, in the conventional substrate processing apparatus, when performing the drying of the substrate, the liquid film of the processing liquid is formed on the surface of the substrate by supplying the processing liquid thereto, and the supply of the drying solution is begun after the supply of the processing liquid is stopped. Accordingly, the liquid film of the processing liquid formed on the surface of the substrate is replaced by the drying solution (see, for example, Japanese Patent Laid-open Publication No. 2010-045389).

The centrifugal force generated by the rotation of the substrate is applied to the liquid film of the processing liquid which is formed on the surface of the substrate. This centrifugal force is stronger at an outer peripheral portion of the substrate than at the central portion thereof. Therefore, after the supply of the processing liquid is stopped and before the liquid film of the drying solution is formed on the entire surface of the substrate after the supply of the drying solution is begun, the liquid film of the processing liquid formed on the outer peripheral portion of the substrate may be shaken off outwards from the substrate, so that the liquid film may be cut at the outer peripheral portion of the substrate. This cutting of the liquid film may easily take place especially in a case where the surface of the substrate is hydrophobized.

Figure 13:
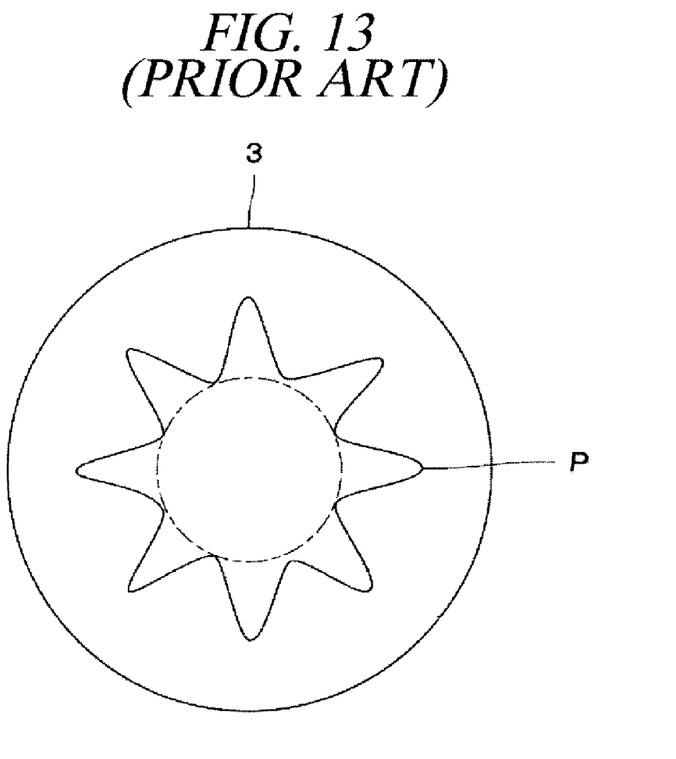
FIG. 13 is a schematic diagram illustrating a state of a liquid film formed on a substrate.

That is, as depicted in a schematic diagram of FIG. 13, though the liquid film of the drying solution is formed without being cut at the central portion of the substrate (within a circular region concentric with the substrate, indicated by a dashed dotted line), the liquid film of the drying solution is cut at the outer peripheral portion of the substrate. As a result, a liquid droplet of the drying solution is formed at the outer peripheral portion of the substrate. If the liquid droplet is dried while a substance (e.g., ammonia) contained in the atmosphere is dissolved in the liquid droplet, a watermark or a particle may be generated on the surface of the substrate.

When supplying the replacement liquid, it may be considered to keep the liquid film of the processing liquid by reducing the centrifugal force by way of decreasing a rotational speed of the substrate. If so, however, a processing time is increased, so that a throughput of the substrate processing apparatus is reduced.

DISCLOSURE OF THE INVENTION

Problems to Be Solved By the Invention

In view of the foregoing, exemplary embodiments provide a technique capable of performing a processing of a substrate successfully by suppressing generation of a fault such as a watermark or a particle which may be caused by cutting of a liquid film.

Means for Solving the Problems

In one exemplary embodiment, a substrate processing apparatus includes a substrate rotating unit configured to hold and rotate a substrate; a processing liquid supplying unit configured to supply a processing liquid to the substrate; and a replacement liquid supplying unit configured to supply, to the substrate, a replacement liquid with which the processing liquid supplied from the processing liquid supplying unit is replaced. While the replacement liquid supplying unit supplies the replacement liquid to the substrate, the processing liquid supplying unit supplies the processing liquid to a position on the substrate positioned at an outer peripheral side thereof than a supply position of the replacement liquid supplied from the replacement liquid supplying unit to form a liquid film of the processing liquid.

The substrate processing apparatus according to the present exemplary embodiment may have one or more characteristics stated below.

The processing liquid supplying unit and the replacement liquid supplying unit respectively supply the processing liquid and the replacement liquid such that an entire surface of the substrate is covered with a liquid film of the processing liquid, the replacement liquid or a mixed solution of the processing liquid and the replacement liquid. Further, the processing liquid supplying unit supplies the processing liquid such that the liquid film of the processing liquid supplied by the processing liquid supplying unit is maintained at an outside of the replacement liquid supplied by the replacement liquid supplying unit.

The replacement liquid supplying unit supplies the replacement liquid to a central portion of the substrate, and the processing liquid supplying unit supplies the processing liquid while moving toward an outer peripheral direction of the substrate.

The processing liquid supplying unit stops the supply of the processing liquid when the processing liquid supplying unit is moved up to a circumferential portion of the substrate.

The processing liquid supplying unit includes a processing liquid main-supply nozzle configured to supply the processing liquid toward a central portion of the substrate; and a processing liquid auxiliary-supply nozzle configured to supply the processing liquid to the position on the substrate positioned at the outer peripheral side thereof than the supply position of the replacement liquid on the substrate.

The processing liquid supplying unit is configured to set a supply flow rate of the processing liquid from the processing liquid auxiliary-supply nozzle to be smaller than a supply flow rate of the processing liquid from the processing liquid main-supply nozzle when the processing liquid main-supply nozzle and the processing liquid auxiliary-supply nozzle supply the processing liquid at the same time.

The processing liquid supplying unit is configured to start the supply of the processing liquid to the position on the substrate positioned at the outer peripheral side thereof than the supply position of the replacement liquid on the substrate before the replacement liquid supplying unit starts the supply of the replacement liquid on the substrate.

The processing liquid supplying unit supplies the processing liquid within a circular region which is concentric with the substrate and is completely covered with the replacement liquid when the replacement liquid is supplied on the substrate and the processing liquid is not supplied to the position on the substrate positioned at the outer peripheral side thereof.

In another exemplary embodiment, a substrate processing method includes a processing liquid main-supplying process of supplying a processing liquid to a substrate which is being rotated; a replacement liquid supplying process of supplying a replacement liquid to the substrate and forming a liquid film of the replacement liquid on the substrate by replacing the processing liquid supplied to the substrate in the processing liquid main-supplying process; and a processing liquid auxiliary-supplying process of forming a liquid film of the processing liquid on the substrate by supplying the processing liquid to a position on the substrate positioned at an outer peripheral side thereof than a supply position of the replacement liquid on the substrate while the replacement liquid is supplied to the substrate.

The substrate processing method according to the present exemplary embodiment may have one or more characteristics stated below.

The liquid film of the processing liquid is formed on an entire surface of the substrate in the processing liquid main-supplying process, and in the processing liquid auxiliary-supplying process, the liquid film of the processing liquid is formed on a region on the surface of the substrate positioned at the outer peripheral side thereof than a region on the surface of the substrate covered with the replacement liquid.

The replacement liquid is supplied toward a central portion of the substrate in the replacement liquid supplying process, and in the processing liquid auxiliary-supplying process, the processing liquid is supplied while moving a supply position of the processing liquid toward the outer peripheral side of the substrate.

A supply flow rate of the processing liquid supplied in the processing liquid auxiliary-supplying process is set to be smaller than a supply flow rate of the processing liquid supplied in the processing liquid main-supplying process.

The supply of the processing liquid in the processing liquid auxiliary-supplying process is begun before the supply of the replacement liquid on the substrate in the replacement liquid supplying process is begun.

In yet another exemplary embodiment, there is provided a computer-readable recording medium having stored thereon computer-executable instructions that, in response to execution, cause a substrate processing apparatus comprising a substrate rotating unit configured to hold and rotate a substrate; a processing liquid supplying unit configured to supply a processing liquid to the substrate; and a replacement liquid supplying unit configured to supply, to the substrate, a replacement liquid with which the processing liquid supplied from the processing liquid supplying unit is replaced to rotate the substrate by substrate rotating unit; supply the processing liquid to the substrate by the processing liquid supplying unit; form a liquid film of the replacement liquid by supplying the replacement liquid to the substrate by the replacement liquid supplying unit; and form a liquid film of the processing liquid by supplying the processing liquid to a position on the substrate positioned at an outer peripheral side thereof than a supply position of the replacement liquid on the substrate by the processing liquid supplying unit.

Effect of the Invention

As stated above, according to the exemplary embodiments, it is possible to suppress the generation of the watermark and the particle without reducing the throughput of the substrate processing apparatus. Thus, the processing of the substrate can be performed effectively.

DETAILED DESCRIPTION

Hereinafter, a specific configuration of a substrate processing apparatus and a substrate processing method according to an exemplary embodiment will be described with reference to the accompanying drawings, which form a part of the description.

Figure 1:
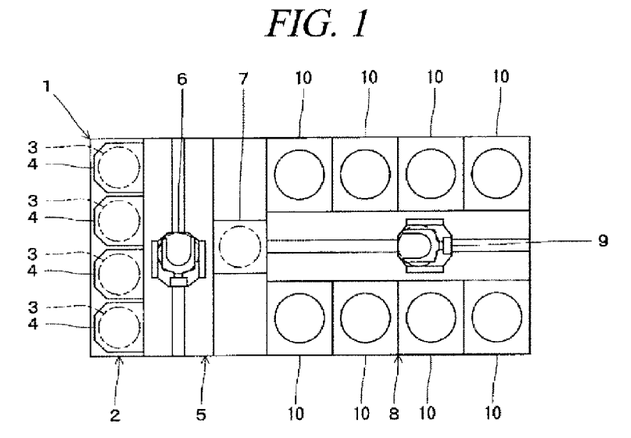
FIG. 1 is a plan view illustrating a substrate processing apparatus.

As depicted in FIG. 1, a substrate processing apparatus 1 is equipped with a carry-in/out station 2 at a front end thereof. Carriers 4, each of which accommodates therein a multiple number (for example, 25 sheets) of substrates 3 (here, semiconductor wafers), are carried into or out of the carry-in/out station 2. In the carry-in/out station 2, the carriers 4 are mounted side by side in a left-and-right direction.

Further, the substrate processing apparatus 1 includes a transfer station 5 at a rear side of the carry-in/out station 2. The transfer station 5 includes a substrate transfer device 6 at a front side thereof and a substrate transit table 7 at a rear side thereof. In this transfer station 5, a substrate 3 is transferred between one of the carriers 4 mounted in the carry-in/out station 2 and the substrate transit table 7 by using the substrate transfer device 6.

Further, the substrate processing apparatus 1 is also equipped with a processing station 8 at the rear side of the transfer station 5. A substrate transfer device 9 extended in a front-and-rear direction is provided at a center of the processing station 8, and substrate liquid processing apparatuses 10 configured to perform a liquid processing on the substrate 3 are arranged in a front-and-rear direction at left and right sides of the substrate transfer device 9. In this processing station 8, the substrate 3 is transferred between the substrate transit table 7 and the substrate liquid processing apparatus 10 by using the substrate transfer device 9, and the liquid processing of the substrate 3 is performed by using the substrate liquid processing apparatus 10.

Figure 2:
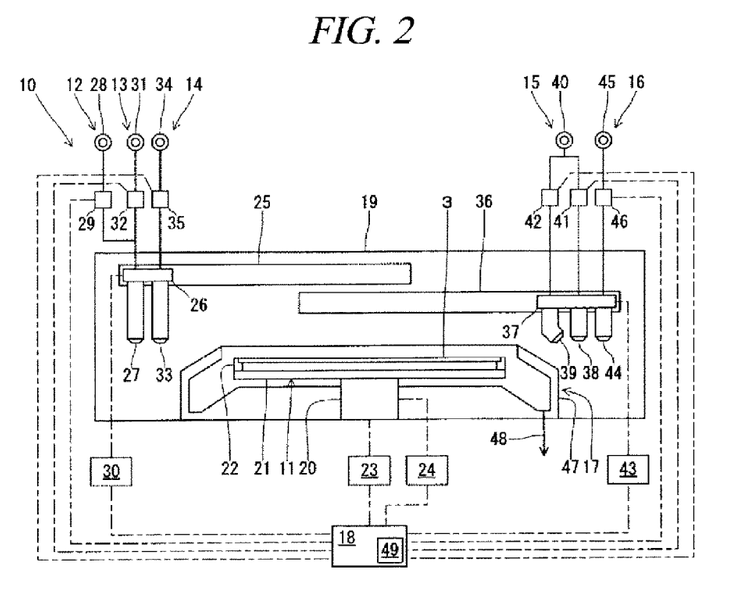
FIG. 2 is a side cross sectional view illustrating a substrate liquid processing apparatus.
Figure 3:
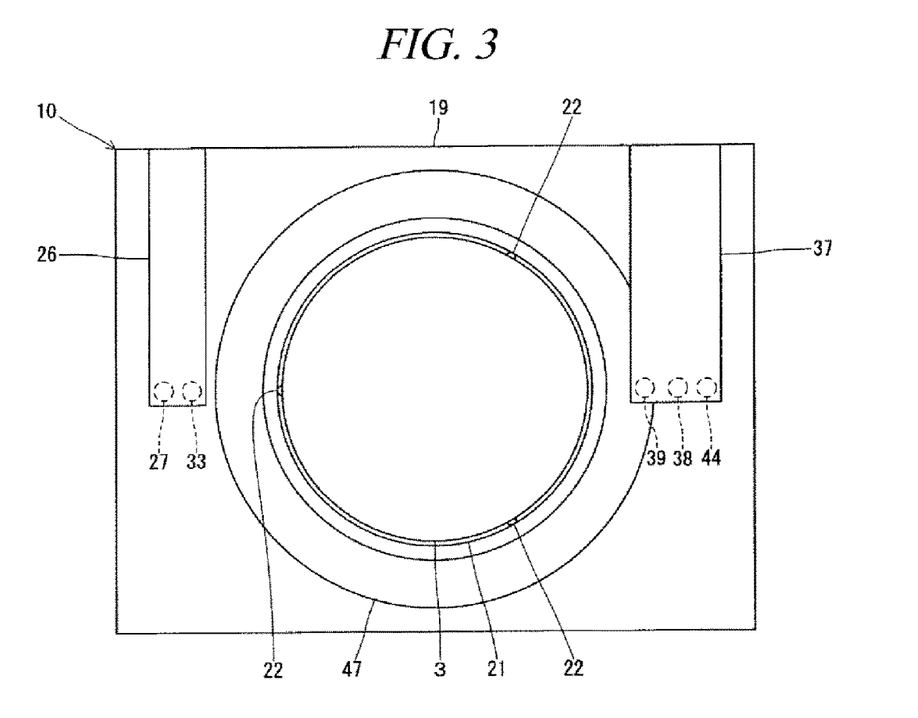
FIG. 3 is a plan view illustrating the substrate liquid processing apparatus.

The substrate liquid processing apparatus 10 includes, as shown in FIG. 2 and FIG. 3, a substrate rotating unit 11, a chemical liquid supplying unit 12, a processing liquid supplying unit (processing liquid main-supplying unit) 13, a replacement liquid supplying unit 14, an inert gas supplying unit 15, a processing liquid auxiliary-supplying unit 16 and a collecting unit 17. Each of these individual units is controlled by a control unit 18. Here, the substrate rotating unit 11 is configured to hold and rotate the substrate 3. The chemical liquid supplying unit 12 is configured to supply a chemical liquid for cleaning to the substrate 3. The processing liquid supplying unit 13 is configured to supply a processing liquid (e.g., pure water) for rinsing to the substrate 3. The replacement liquid supplying unit 14 is configured to supply a replacement liquid (here, a drying solution having higher volatility than the processing liquid, e.g., IPA) to the substrate 3. The inert gas supplying unit 15 is configured to supply an inert gas to the substrate 3. The processing liquid auxiliary-supplying unit 16 is configured to additionally supply the processing liquid to an outer peripheral portion of the substrate 3 in order to maintain a liquid film on the entire surface of the substrate 3. That is, the processing liquid supplying unit (processing liquid main-supplying unit) 13 and the processing liquid auxiliary-supplying unit 16 serve as a "processing liquid supplying unit" configured to supply the processing liquid to the substrate 3. The collecting unit 17 is configured to collect the chemical liquid, the processing liquid, the replacement liquid or the like.

The substrate rotating unit 11 is equipped with a vertically elongated rotation shaft 20 which is rotatable and provided at a substantially central portion within a substrate processing chamber 19. A circular plate-shaped turntable 21 is horizontally provided on an upper end of the rotation shaft 20. Three substrate holders 22 are arranged on an outer peripheral edge portion of the turntable 21 at a regular interval in a circumferential direction thereof.

A substrate rotating device 23 and a substrate elevating device 24 are connected to the rotation shaft 20 of the substrate rotating unit 11. Operations of the substrate rotating device 23 and the substrate elevating device 24 are controlled by the control unit 18.

The substrate rotating unit 11 is configured to hold the substrate 3 horizontally with the substrate holders 22 of the turntable 21. The turntable 21 and the substrate 3 held by the turntable 21 are rotated by driving the substrate rotating device 23, and are moved up and down by driving the substrate elevating device 24.

The chemical liquid supplying unit 12 is equipped with a guide rail 25 which is horizontally extended in the left-and-right direction within the substrate processing chamber 19. An arm 26 which is horizontally extended in the front-and-rear direction is provided at the guide rail 25 and is configured to be moved in the left-and-right direction. A chemical liquid/processing liquid supply nozzle 27 is provided vertically downwards at a left lower portion of a leading end of the arm 26. A chemical liquid supply source 28 configured to supply the chemical liquid for cleaning is connected to the chemical liquid/processing liquid supply nozzle 27 via a flow rate controller 29. This flow rate controller 29 is controlled by the control unit 18.

Further, a first nozzle moving mechanism 30 is connected to the arm 26 of the chemical liquid supplying unit 12. This first nozzle moving mechanism 30 is controlled by the control unit 18.

The chemical liquid/processing liquid supply nozzle 27 also belongs to the processing liquid supplying unit 13. A processing liquid supply source 31 configured to supply the rinse liquid as the processing liquid is connected to the chemical liquid/processing liquid supply nozzle 27 via a flow rate controller 32. This flow rate controller 32 is controlled by the control unit 18.

The chemical liquid/processing liquid supply nozzle 27 belonging to both the chemical liquid supplying unit 12 and the processing liquid supplying unit 13 is configured to be movable by the first nozzle moving mechanism 30 between a position (supply starting position) above a central portion of the substrate 3 and a position (retreat position) at a left outside of the substrate 3 when viewed from the top, and is configured to discharge the chemical liquid for cleaning and the processing liquid for rinsing toward a surface (top surface) of the substrate 3. Here, in the present exemplary embodiment, either the chemical liquid or the processing liquid is selectively discharged from the single chemical liquid/processing liquid supply nozzle 27. However, the chemical liquid and the processing liquid may be discharged from separate nozzles.

The replacement liquid supplying unit 14 is equipped with a replacement liquid supply nozzle 33 which is provided vertically downwards at a right lower portion of the leading end of the arm 26. A replacement liquid supply source 34 configured to supply the replacement liquid is connected to the replacement liquid supply nozzle 33 via a flow rate controller 35. This flow rate controller 35 is controlled by the control unit 18.

The replacement liquid supply nozzle 33 of the replacement liquid supplying unit 14 is configured to be moved by the first nozzle moving mechanism 30 between the position (supply starting position) above the central portion of the substrate 3 and a position (retreat position) at a left outside of the substrate 3 when viewed from the top, and is configured to discharge the replacement liquid toward the surface (top surface) of the substrate 3.

The inert gas supplying unit 15 is equipped with a guide rail 36 which is horizontally extended in the left-and-right direction within the substrate processing chamber 19. An arm 37 which is horizontally extended in the front-and-rear direction is provided at the guide rail 36 and is configured to be moved in the left-and-right direction. A first inert gas supply nozzle 38 is provided vertically downwards at a central lower portion of a leading end of the arm 37. Further, a second inert gas supply nozzle 39 is provided at a left lower portion of the leading end of the arm 37 toward a downward right side. An inert gas supply source 40 configured to supply the inert gas (e.g., nitrogen gas) is connected to the first and second inert gas supply nozzles 38 and 39 via flow rate controllers 41 and 42, respectively. These flow rate controllers 41 and 42 are controlled by the control unit 18.

Further, the arm 37 of the inert gas supplying unit 15 is connected with a second nozzle moving mechanism 43. The second nozzle moving mechanism 43 is controlled by the control unit 18.

The first and second inert gas supply nozzles 38 and 39 of the inert gas supplying unit 15 are configured to be moved by the second nozzle moving mechanism 43 between the position (supply starting position) above the central portion of the substrate 3 and a position (retreat position) at a right outside of the substrate 3 when viewed from the top, and is configured to discharge the inert gas toward the surface (top surface) of the substrate 3. The inert gas is discharged vertically downwards toward the surface of the substrate 3 from the first inert gas supply nozzle 38. Meanwhile, the inert gas is discharged diagonally downwards toward the outer peripheral side of the surface of the substrate 3 from the second inert gas supply nozzle 39.

The processing liquid auxiliary-supplying unit 16 is equipped with a processing liquid auxiliary-supply nozzle 44 which is provided at a right lower portion of the leading end of the arm 37, vertically facing downwards. A processing liquid supply source 45 configured to supply the processing liquid is connected to the processing liquid auxiliary-supply nozzle 44 via a flow rate controller 46. This flow rate controller 46 is controlled by the control unit 18. Further, though the two individual processing liquid supply sources 45 and 31 are provided in the present exemplary embodiment, it may be possible to supply the processing liquid to both the chemical liquid/processing liquid supply nozzle 27 and the processing liquid auxiliary-supply nozzle 44 from a single processing liquid supply source.

The processing liquid auxiliary-supply nozzle 44 of this processing liquid auxiliary-supplying unit 16 is configured to be moved by the second nozzle moving mechanism 43 between a position (supply starting position) above the central portion of the substrate 3 and a position (retreat position) at a right outside of the substrate 3 when viewed from the top, and is configured to discharge the processing liquid toward the surface (top surface) of the substrate 3.

The collecting unit 17 includes a circular ring-shaped collecting cup 47 provided around the turntable 21. The collecting cup 47 has an opening at a top end thereof, and this opening has a size larger than the turntable 21. Furthermore, a drain 48 is connected to a bottom end portion of the collecting cup 47. The collecting unit 17 collects the processing liquid or the replacement liquid supplied onto the surface of the substrate 3 with the collecting cup 47 and drains the collected liquids to the outside through the drain 48.

The substrate processing apparatus 1 is controlled by the control unit 18 (computer) to perform a processing of the substrate 3 according to various programs stored on a recording medium 49 which is provided in the control unit 18. The recording medium 49 stores thereon various kinds of setup data or programs. The recording medium 49 is implemented by, but not limited to, a memory such as a ROM or a RAM, or a disk-type recording medium such as a hard disk, a CO-ROM, a DVD-ROM or a flexible disk, as commonly known in the art.

Figure 4:
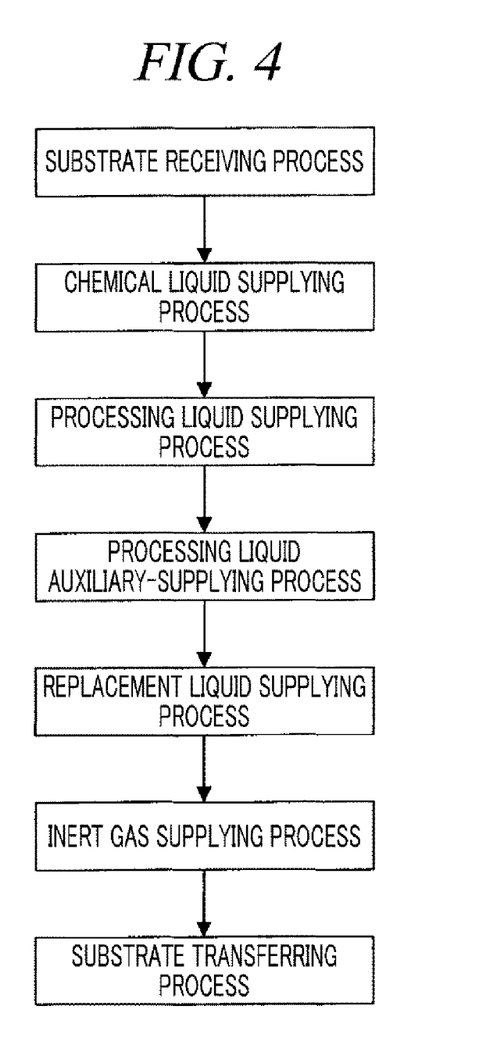
FIG. 4 is a flowchart for describing a substrate processing program.

The substrate processing apparatus 1 processes the substrate 3 to be described below according to a substrate processing program (see FIG. 4) stored in the recording medium 49.

Figure 5:
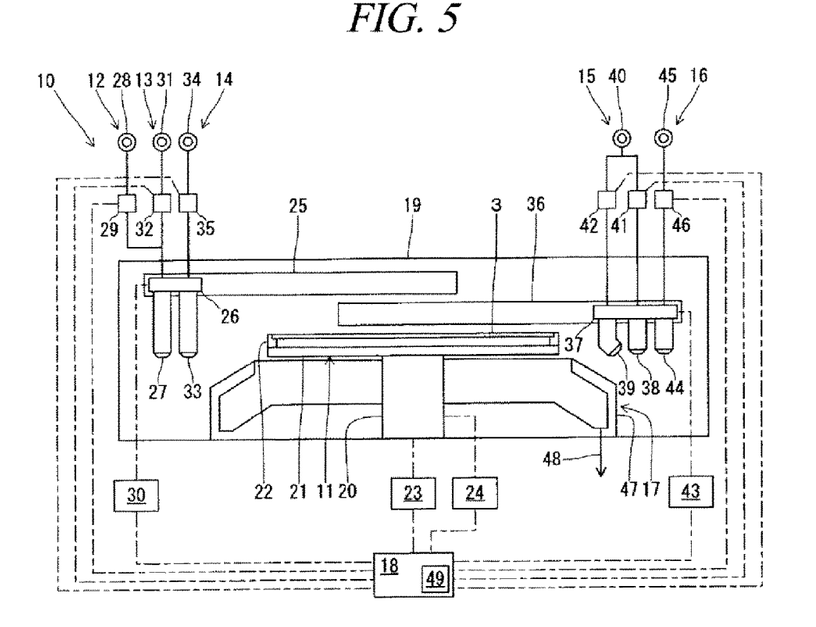
FIG. 5 is an explanatory diagram for describing an operation (a substrate receiving process and a substrate transferring process) of the substrate processing apparatus.

First, as shown in FIG. 5, the substrate 3 transferred by the substrate transfer device 9 is received by the substrate liquid processing apparatus 10 (substrate receiving process).

In this substrate receiving process, the control unit 18 moves the turntable 21 up to a preset position by the substrate elevating device 24. Then, the single sheet of substrate 3 carried into the substrate processing chamber 19 by the substrate transfer device 9 is received and held horizontally by the substrate holders 22. Thereafter, the turntable 21 is moved down to a preset position by the substrate elevating device 24. Further, in the substrate receiving process, the chemical liquid/processing liquid supply nozzle 27, the replacement liquid supply nozzle 33, the first and second inert gas supply nozzles 38 and 39 and the processing liquid auxiliary-supply nozzle 44 are kept retreated at the retreat positions positioned outside of the turntable 21.

Figure 6:
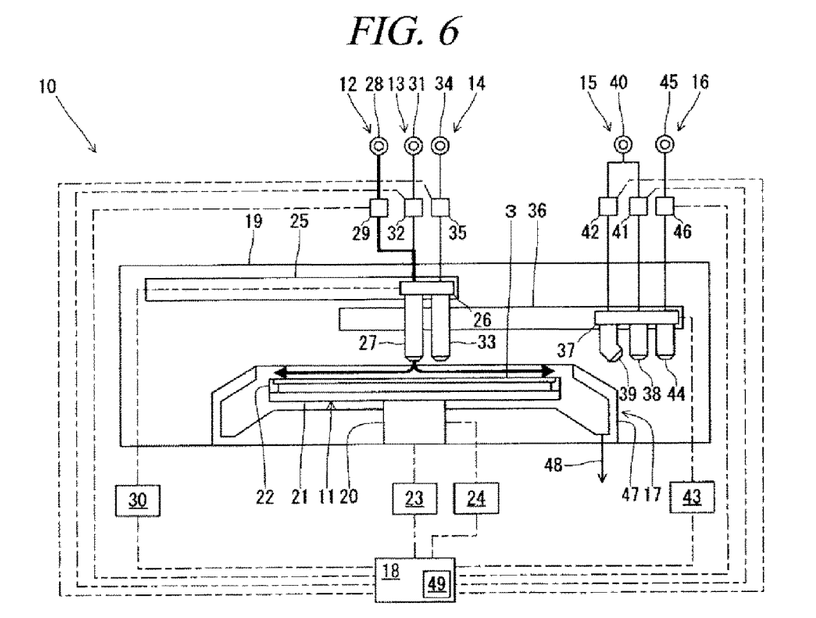
FIG. 6 is an explanatory diagram for describing an operation (a chemical liquid supplying process) of the substrate processing apparatus.

Subsequently, the substrate processing apparatus 1 performs a cleaning of the substrate 3 by supplying the chemical liquid onto the surface of the substrate 3, as shown in FIG. 6 (chemical liquid supplying process).

In this chemical liquid supplying process, the control unit 18 moves the arm 26 by the first nozzle moving mechanism 30 and locates the chemical liquid/processing liquid supply nozzle 27 at the supply starting position above the central portion of the substrate 3. Further, by rotating the turntable 21 through the substrate rotating device 23 at a preset speed, the substrate 3 is rotated. Then, the chemical liquid is discharged from the chemical liquid/processing liquid supply nozzle 27 toward the surface of the substrate 3 while a flow rate of the chemical liquid is adjusted to a predetermined flow rate by the flow rate controller 29. Further, the chemical liquid supplied onto the substrate 3 is collected into the collecting cup 47, and is drained to the outside through the drain 48. Then, the discharge of the chemical liquid is stopped by the flow rate controller 29.

Figure 7:
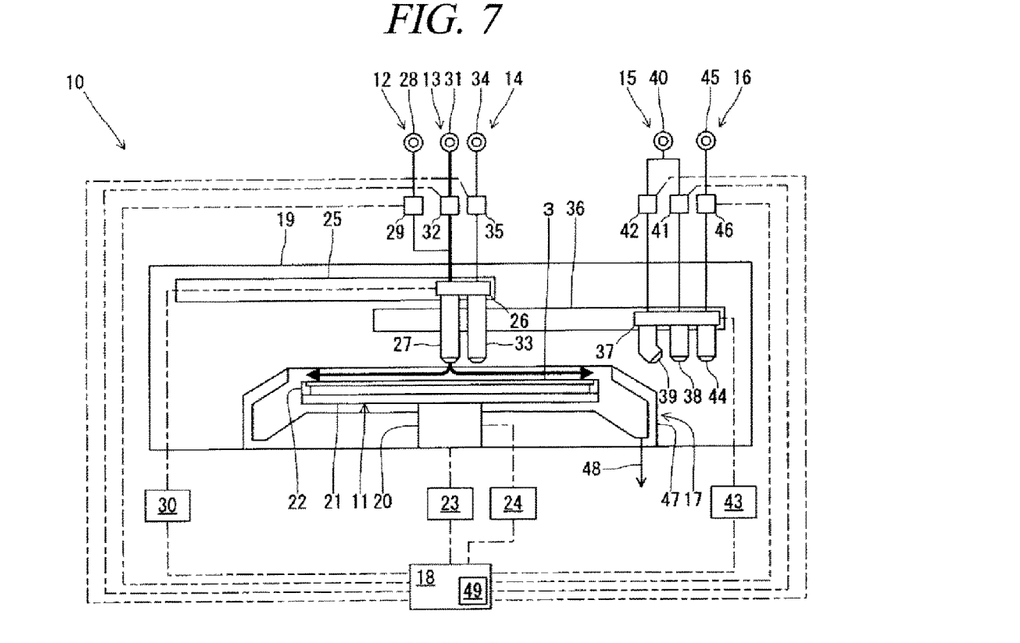
FIG. 7 is an explanatory diagram for describing an operation (a processing liquid supplying process) of the substrate processing apparatus.

Subsequently, the substrate processing apparatus 1 performs a rinsing of the substrate 3 by supplying the processing liquid to the surface of the substrate 3, as depicted in FIG. 7 (processing liquid supplying process).

In this processing liquid supplying process, while maintaining the chemical liquid/processing liquid supply nozzle 27 at the position above the central portion of the substrate 3, the control unit 18 discharges the processing liquid having a preset flow rate controlled by the flow rate controller 32 toward the surface of the substrate 3 which is being rotated from the chemical liquid/processing liquid supply nozzle 27. As a result, a liquid film of the processing liquid is formed on the surface of the substrate 3. The discharge flow rate of the processing liquid is adjusted such that the liquid film of the processing liquid is formed on the entire surface of the substrate 3 continuously. Furthermore, the processing liquid supplied onto the substrate 3 is collected by the collecting cup 47, and is drained to the outside through the drain 48.

Figure 8:
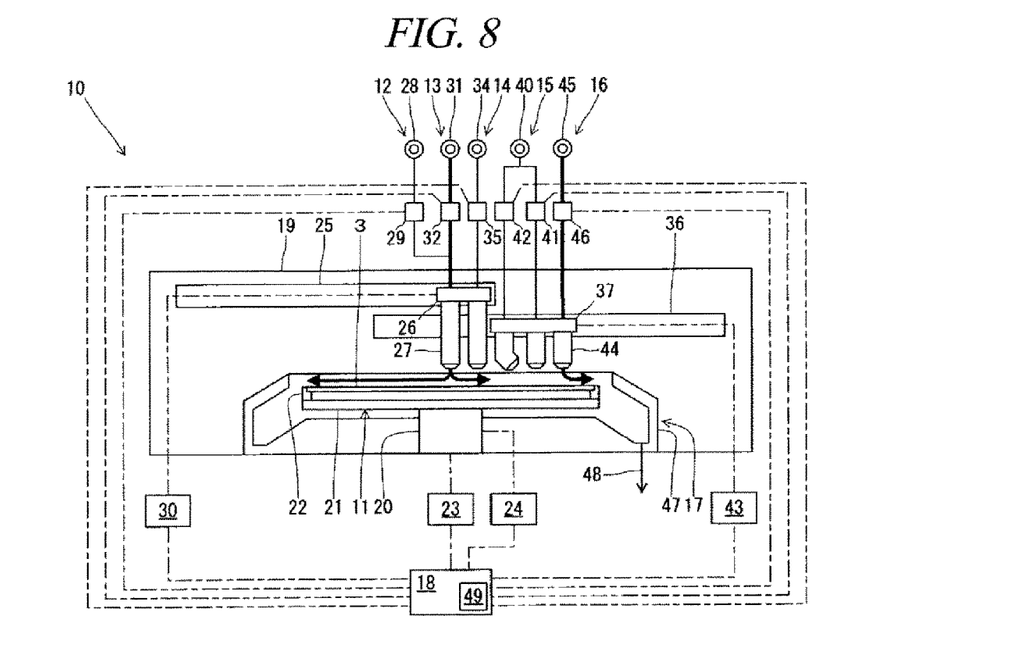
FIG. 8 is an explanatory diagram for describing an operation (a processing liquid auxiliary-supplying process) of the substrate processing apparatus.
Figure 9:
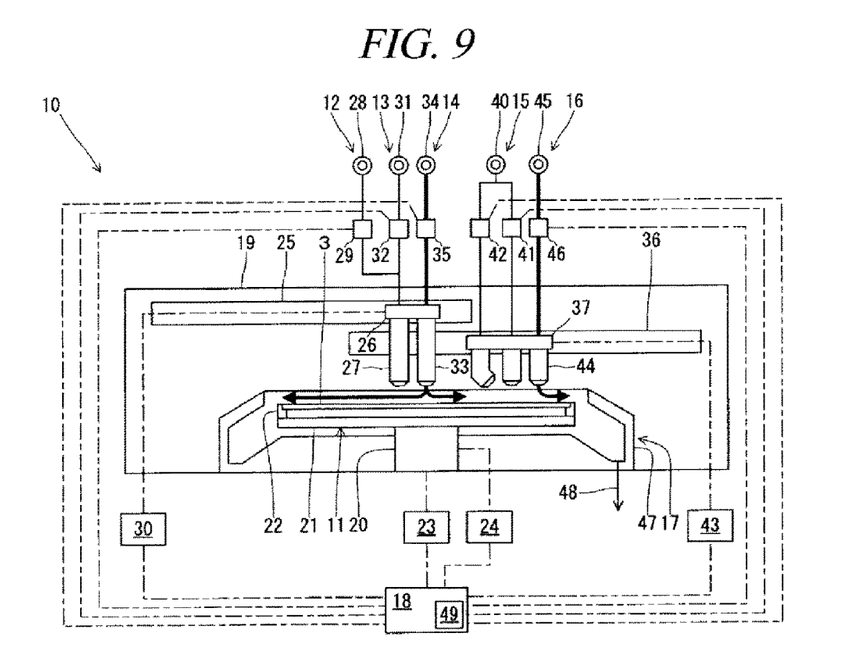
FIG. 9 is an explanatory diagram for describing an operation (the processing liquid auxiliary-supplying process) of the substrate processing apparatus.
Figure 10:
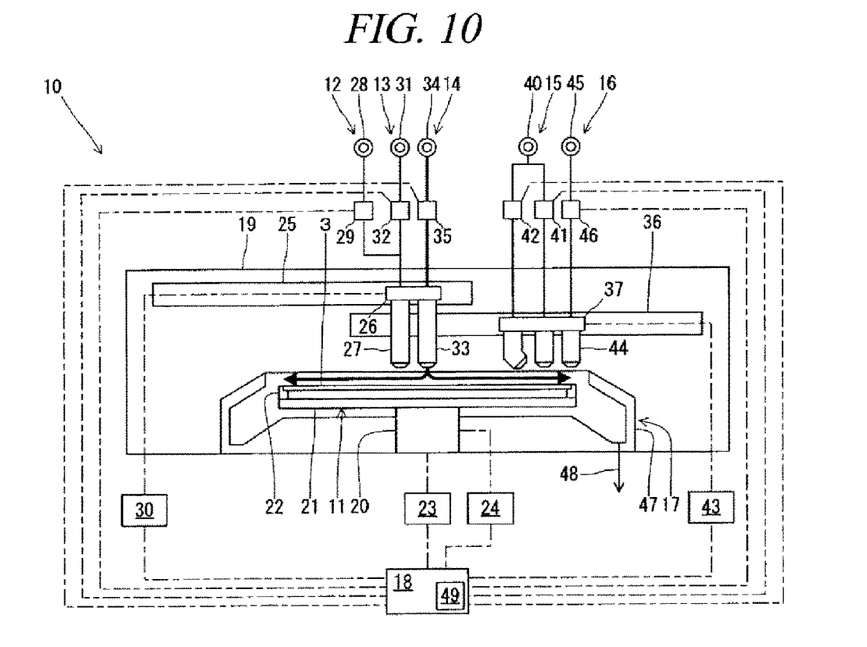
FIG. 10 is an explanatory diagram for describing an operation (a replacement liquid supplying process) of the substrate processing apparatus.

Then, as shown in FIG. 8 to FIG. 10, while performing a processing liquid auxiliary-supplying process of supplying the processing liquid to the outer peripheral portion of the surface of the substrate 3, a replacement liquid supplying process of replacing the processing liquid on the substrate 3 by supplying the replacement liquid onto the central portion of the surface of the substrate 3 is also performed.

When starting the processing liquid auxiliary-supplying process, while continuing the supply of the processing liquid onto the central portion of the substrate 3 from the chemical liquid/processing liquid supply nozzle 27, the same kind of processing liquid as discharged from the chemical liquid/processing liquid supply nozzle 27 is supplied toward the outer peripheral portion of the substrate 3 from the processing liquid auxiliary-supply nozzle 44, as illustrated in FIG. 8. That is, the control unit 18 discharges the processing liquid having the preset flow rate controlled by the flow rate controller 32 toward the central portion of the substrate 3 from the chemical liquid/processing liquid supply nozzle 27. Further, the arm 37 is moved by the second nozzle moving mechanism 43, and the processing liquid auxiliary-supply nozzle 44 is located at the supply starting position above the outer peripheral portion of the substrate 3 positioned outer than the central portion thereof. Thereafter, the processing liquid having a predetermined flow rate controlled by the flow rate controller 46 is discharged toward the surface of the substrate 3 from the processing liquid auxiliary-supply nozzle 44. As a result, the liquid film of the processing liquid formed on the surface of the substrate 3 is maintained. At this time, by setting the flow rate of the processing liquid discharged from the processing liquid auxiliary-supply nozzle 44 to be smaller than the flow rate of the processing liquid discharged from the chemical liquid/processing liquid supply nozzle 27, the processing liquid is suppressed from being scattered from the surface of the substrate 3. Furthermore, the processing liquid supplied onto the substrate 3 is collected by the collecting cup 47, and is drained to the outside through the drain 48.

After the processing liquid auxiliary-supplying process is begun, the processing liquid supplying process is ended, and the replacement liquid supplying process is begun, as shown in FIG. 9. That is, the control unit 18 locates the replacement liquid supply nozzle 33 at the supply starting position above the central portion of the substrate 3 by moving the arm 26 through the first nozzle moving mechanism 30. Then, the discharge of the processing liquid from the chemical liquid/processing liquid supply nozzle 27 is stopped by the flow rate controller 32, and the replacement liquid adjusted to have a preset flow rate by the flow rate controller 35 is discharged vertically downwards toward the surface of the substrate 3 from the replacement liquid supply nozzle 33.

After the processing liquid is supplied for a preset time period from the starting of the replacement liquid supplying process, the processing liquid auxiliary-supplying process is finished, as depicted in FIG. 10. That is, the control unit 18 controls the flow rate controller 46 to stop the discharge of the processing liquid. Further, the replacement liquid is kept discharged onto the substrate 3 from the replacement liquid supply nozzle 33. As a result, the liquid film of the replacement liquid is formed on the entire surface of the substrate 3. Further, the replacement liquid supplied onto the substrate 3 is collected by the collecting cup 47 and is drained to the outside through the drain 48.

As stated, when supplying the replacement liquid, the supply of the processing liquid onto the substrate 3 is not completely stopped, but the processing liquid is supplied to a position at the outer peripheral side of the substrate 3 than the supply position where the replacement liquid is supplied. Thus, it is possible to suppress the liquid film on the substrate 3 from being cut by the centrifugal force and maintain a state in which a continuous liquid film (a liquid film of the replacement liquid, or a liquid film of a mixed solution of the processing liquid and the replacement liquid) is formed on the entire surface of the substrate 3 without being cut. That is, the liquid film of the mixed solution of the processing liquid and the replacement liquid is formed on the outer peripheral region than the position (processing liquid supply position) to which the processing liquid from the processing liquid auxiliary-supply nozzle 44 is supplied. Further, the liquid film of the replacement liquid (or the liquid film of the replacement liquid containing the previously supplied processing liquid and having a concentration higher than a concentration of the replacement liquid in the mixed solution) is formed on an inner peripheral region than the processing liquid supply position. Here, the liquid film formed on the outer peripheral region than the processing liquid supply position has a thickness larger than that of the liquid film formed on the inner peripheral region than the processing liquid supply position. Therefore, when the supply of the processing liquid from the processing liquid auxiliary-supply nozzle 44 is stopped, before the mixed solution of the processing liquid and the replacement liquid is shaken off outwards from the outer peripheral portion of the substrate and the liquid film is cut at the outer peripheral portion of the substrate, the replacement liquid supplied from the replacement liquid supply nozzle 33 reaches the outer peripheral portion of the substrate, so that the continuous liquid film of the replacement liquid is formed on the entire surface of the substrate 3 without being cut on the way. Especially, since the liquid film located at the outer peripheral region than the processing liquid supply position is formed of the mixed solution of the processing liquid and the replacement liquid having a smaller surface tension than the processing liquid, this liquid film is hard to cut when the supply of the processing liquid from the processing liquid auxiliary-supply nozzle 44 is stopped. Therefore, it is possible to suppress generation of the water mark or the particle that might be caused by the stay of the replacement liquid in the droplet shape on the surface of the substrate 3. If the processing liquid is not supplied at all when supplying the replacement liquid in the conventional way, the liquid film of the replacement liquid is surely formed at the central portion (an inside region of a dashed dotted line in a radial direction in FIG. 13) of the substrate 3, whereas the liquid film of the replacement liquid is cut at the outside of the central portion, as can be seen from an outline P of the liquid film of the replacement liquid schematically illustrated in FIG. 13. In view of this, in the processing liquid auxiliary-supplying process, it is desirable to supply the processing liquid from the processing liquid auxiliary-supply nozzle 44 to a region (the inside region of the dashed dotted line in the radial direction) which is securely covered with the liquid film of the replacement liquid when the replacement liquid is supplied to the central portion of the substrate 3 from the replacement liquid supply nozzle 33 without supplying the processing liquid from the processing liquid auxiliary-supply nozzle 44. In this way, the liquid film can be maintained at the outer peripheral portion of the substrate as well. Furthermore, the replacement liquid supplying process may be begun at the same time as the processing liquid auxiliary-supplying process. Moreover, when the replacement liquid supplying process is performed, it may be also possible to discharge the processing liquid from the processing liquid auxiliary-supply nozzle 44 while horizontally moving the processing liquid auxiliary-supply nozzle 44 outwards to the right (to the outside in the radial direction) along the substrate 3 by the second nozzle moving mechanism 43. With this operation, the liquid film of the replacement liquid on the substrate 3 can be gradually expanded outwards as the supply position of the processing liquid is moved. Therefore, it is possible to maintain the liquid film more securely.

Then, in the substrate processing apparatus 1, a drying of the substrate 3 is performed by removing the replacement liquid from the surface of the substrate 3 by discharging the inert gas to the substrate 3 (inert gas supplying process). This inert gas supplying process includes a central portion drying process of drying only the central portion of the substrate 3 partially by discharging the inert gas to the central portion of the substrate 3; and a peripheral portion drying process of drying the entire portion of the substrate 3 finally by gradually expanding a drying region from the central portion of the substrate 3 toward the outer peripheral side thereof while moving a discharging position of the inert gas from the central portion of the substrate 3 toward the outer peripheral side thereof.

Figure 11:
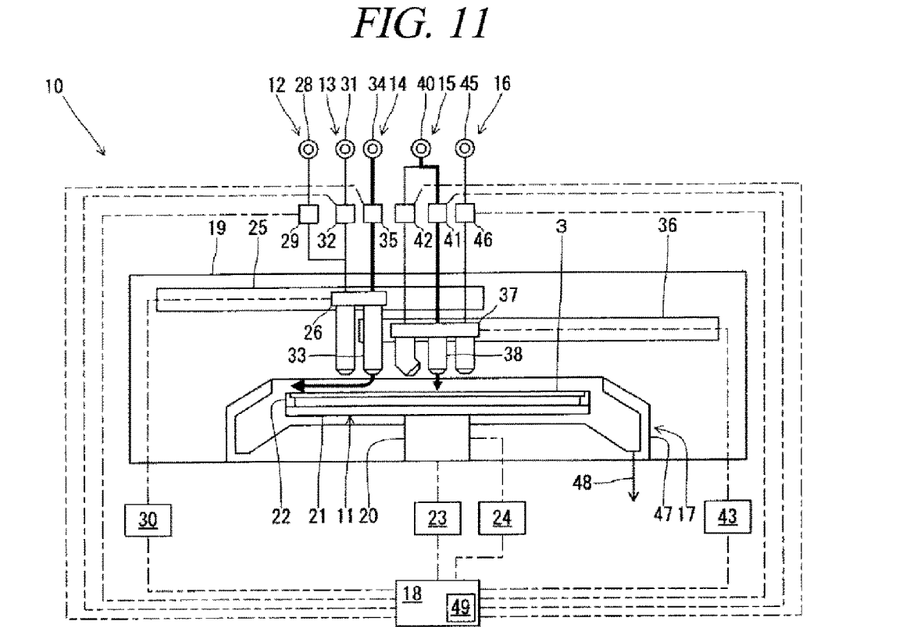
FIG. 11 is an explanatory diagram for describing an operation (an inert gas supplying process) of the substrate processing apparatus.

In the central portion drying process, as shown in FIG. 11, the control unit 18 discharges the replacement liquid adjusted to have the preset flow rate by the flow rate controller 35 toward the surface of the substrate 3 vertically downwards from the replacement liquid supply nozzle 33 while horizontally moving the replacement liquid supply nozzle 33 outwards to the left (to the outside in the radial direction) along the substrate 3 by the first nozzle moving mechanism 30. Further, by moving the arm 37 through the second nozzle moving mechanism 43, the first inert gas supply nozzle 38 is moved to the supply starting position above the central portion of the substrate 3. Then, the inert gas adjusted to have a preset flow rate by the flow rate controller 41 is discharged toward the surface of the substrate 3 vertically downwards from the first inert gas supply nozzle 38. At this time, the first inert gas supply nozzle 38 is kept to be stopped at the position above the central portion of the substrate 3 without driving the second nozzle moving mechanism 43. In this central portion drying process, the inert gas is discharged toward the central portion of the substrate 3 vertically downwards from the first inert gas supply nozzle 38 which is stopped above the central portion of the substrate 3. As a result, only the liquid film of the replacement liquid formed at the central portion of the surface of the substrate 3 is removed outwards, so that only the central portion of the substrate 3 is dried.

Figure 12:
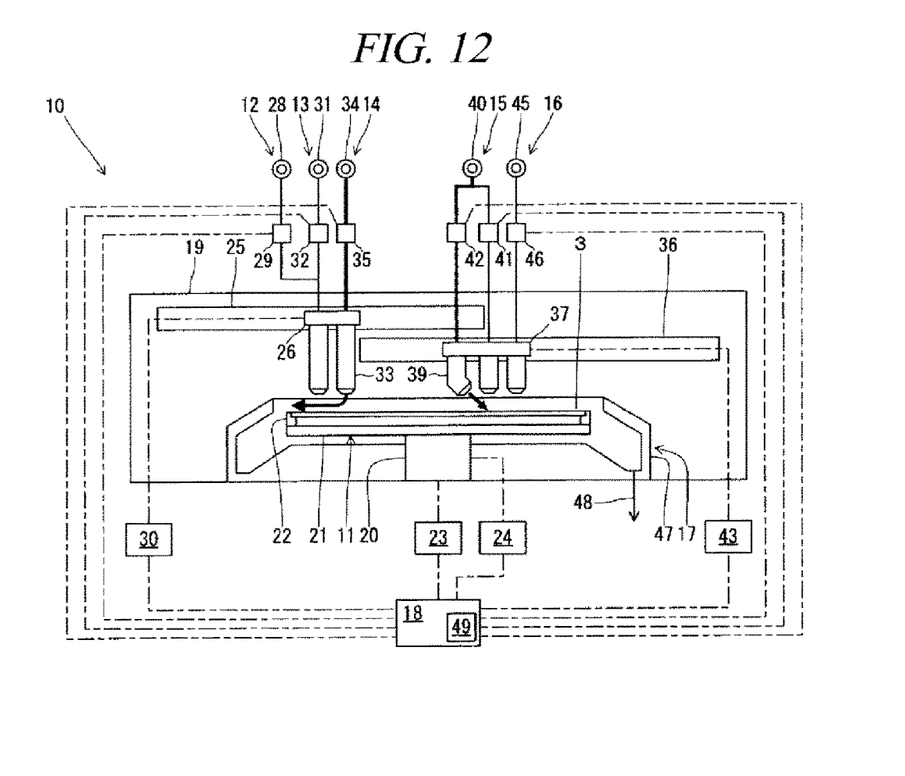
FIG. 12 is an explanatory diagram for describing an operation (the inert gas supplying process) of the substrate processing apparatus.

Then, in the peripheral portion drying process, as shown in FIG. 12, the control unit 18 moves the second inert gas supply nozzle 39 to the supply starting position above the center portion of the substrate 3 by moving the arm 37 through the second nozzle moving mechanism 43 after stopping the discharge of the inert gas from the first inert gas supply nozzle 38 by the flow rate controller 41. Then, the inert gas adjusted to have a preset flow rate by the flow rate controller 42 is discharged onto the surface of the substrate 3 from the second inert gas supply nozzle 39 outwards in an inclined direction from above the substrate 3. At this time, the second inert gas supply nozzle 39 is moved horizontally along the substrate 3 from the center of the substrate 3 toward a right periphery portion thereof by the second nozzle moving mechanism 43. Further, while horizontally moving the replacement liquid supply nozzle 33 outwards to the left along the substrate 3 by the first nozzle moving mechanism 30, the replacement liquid adjusted to have a preset flow rate by the flow rate controller 35 is discharged toward the surface of the substrate 3 vertically downwards from the replacement liquid supply nozzle 33. Afterwards, the discharge of the replacement liquid and the discharge of the inert gas are stopped by the flow rate controllers 35 and 42, respectively. Upon the lapse of a preset time after the discharge of the replacement liquid and the discharge of the inert gas are stopped, the rotation of the substrate 3 (turntable 21) is stopped by the substrate rotating device 23. At the final stage of the peripheral portion drying process, by moving the arm 26 through the first nozzle moving mechanism 30, the replacement liquid supply nozzle 33 is moved to the retreat position positioned outside of the edge of the substrate 3 at the left side. Further, by moving the arm 37 through the second nozzle moving mechanism 43, the first and second inert gas supply nozzles 38 and 39 are moved to the retreat positions positioned outside of the edge of the substrate 3 at the right side.

Finally, in the substrate processing apparatus 1, the substrate 3 is transferred from the substrate liquid processing apparatus 10 to the substrate transfer device 9, as shown in FIG. 5 (substrate transferring process).

In this substrate transferring process, the control unit 18 moves the turntable 21 up to a preset position by the substrate elevating device 24. Then, the substrate 3 held by the turntable 21 is transferred to the substrate transfer device 9. Thereafter, the turntable 21 is moved down to a preset position by the substrate elevating device 24.

Further, in the substrate processing apparatus 1, though the processing liquid supplying unit (processing liquid main-supplying unit) 13 and the processing liquid auxiliary-supplying unit 16 are provided at the separate arms 26 and 37, the exemplary embodiment is not limited thereto, and they may be provided at a single arm. Further, though the chemical liquid supplying unit 12 and the processing liquid supplying unit 13 are provided at the single arm 26, these supplying units may be provided at separate arms individually. Furthermore, though the inert gas supplying unit 15 has the first inert gas supply nozzle 38 and the second inert gas supply nozzle 39, the inert gas supplying unit 15 may have either one of them. In addition, the supply position of the processing liquid onto the substrate 3 from the processing liquid auxiliary-supply nozzle 44 needs to be located at the outer peripheral side of the substrate 3 than the supply position of the replacement liquid from the replacement liquid supply nozzle 33. However, there is a concern that the processing liquid or the replacement liquid may be dispersed by a collision between the processing liquid and the replacement liquid on the surface of the substrate 3 depending on conditions such as a distance between the supply position of the processing liquid (position of the processing liquid auxiliary-supply nozzle 44) onto the substrate 3 from the processing liquid auxiliary-supply nozzle 44 and the supply position of the replacement liquid (position of the replacement liquid supply nozzle 33) onto the substrate 3 from the replacement liquid supply nozzle 33, the supply flow rate of the processing liquid from the processing liquid auxiliary-supply nozzle 44, the supply flow rate of the replacement liquid from the replacement liquid supply nozzle 33, the rotational speed of the substrate 3, and so forth. For this reason, it is desirable to conduct an experiment or the like to investigate a range of conditions where the dispersion of the processing liquid or the replacement liquid does not occur and to set the aforementioned various conditions within that range. Further, in the above-described exemplary embodiment, the rinse liquid serving as the processing liquid is supplied together with the replacement liquid in case of replacing the rinse liquid serving as the processing liquid with the replacement liquid after performing the rinsing of the substrate 3. However, the exemplary embodiment is not limited thereto, and the same process may be performed in case of replacing a hydrophobizing solution serving as the processing liquid with the replacement liquid after performing a hydrophobizing of the substrate 3.

As stated above, in the exemplary embodiment, when replacing the processing liquid on the substrate 3 with the replacement liquid by supplying the replacement liquid onto the substrate 3 after processing the substrate 3 by forming the liquid film of the processing liquid on the entire surface of the substrate 3 by supplying the processing liquid onto the substrate 3 which is being rotated, the processing liquid is supplied to the position on the substrate 3 located at the outer peripheral side thereof than the supply position of the replacement liquid onto the substrate 3, so that there is maintained the state in which the entire surface of the substrate 3 is covered with the liquid film. Since such a state in which the entire surface of the substrate 3 is covered with the liquid film can be maintained without reducing the rotational speed of the substrate 3, it is possible to suppress the generation of the water mark or the particle without reducing the throughput of the substrate processing apparatus 1. Therefore, the substrate 3 can be processed well. If the supply flow rate of the replacement liquid is increased, immediately after the replacement liquid is supplied it may occur that the entire surface of the substrate 3 is covered with the liquid film of the replacement liquid without supplying the processing liquid. In such a case, however, consumption amount of the replacement liquid may be increased considerably. According to the exemplary embodiment, however, it is possible to form the liquid film on the entire surface of the substrate 3 without increasing the consumption amount of the replacement liquid.

EXPLANATION OF REFERENCE NUMERALS

1: Substrate processing apparatus
11: Substrate rotating unit
12: Chemical liquid supplying unit
13: Processing liquid supplying unit
14: Replacement liquid supplying unit
15: Inert gas supplying unit
16: Processing liquid auxiliary-supplying unit
18: Control unit

We claim:
1. A substrate processing method, comprising:
a processing liquid main-supplying process of supplying a first processing liquid to a substrate which is being rotated;
a replacement liquid supplying process of supplying a replacement liquid to the substrate and forming a liquid film of the replacement liquid on the substrate by replacing the first processing liquid supplied to the substrate in the processing liquid main-supplying process; and
a processing liquid auxiliary-supplying process of forming a liquid film of a second processing liquid on the substrate by supplying the second processing liquid to a position on the substrate positioned at an outer peripheral side thereof than a supply position of the replacement liquid on the substrate while the replacement liquid is supplied to the substrate,
wherein a supply flow rate of the second processing liquid supplied in the processing liquid auxiliary-supplying process is set to be smaller than a supply flow rate of the first processing liquid supplied in the processing liquid main-supplying process.
2. The substrate processing method of claim 1,
wherein a liquid film of the first processing liquid is formed on an entire surface of the substrate in the processing liquid main-supplying process, and
in the processing liquid auxiliary-supplying process, the liquid film of the second processing liquid is formed on a region on the surface of the substrate positioned at the outer peripheral side thereof than a region on the surface of the substrate covered with the replacement liquid.
3. The substrate processing method of claim 1,
wherein the replacement liquid is supplied toward a central portion of the substrate in the replacement liquid supplying process, and
in the processing liquid auxiliary-supplying process, the second processing liquid is supplied while moving a supply position of the second processing liquid toward the outer peripheral side of the substrate.
4. The substrate processing method of claim 1,
wherein the supply of the second processing liquid in the processing liquid auxiliary-supplying process is begun before the supply of the replacement liquid on the substrate in the replacement liquid supplying process.
5. A computer-readable recording medium having stored thereon computer-executable instructions that, in response to execution, controls a substrate processing apparatus comprising a substrate rotating unit configured to hold and rotate a substrate; a processing liquid supplying unit configured to supply a first processing liquid to the substrate; a replacement liquid supplying unit configured to supply to the substrate a replacement liquid with which the first processing liquid supplied from the processing liquid supplying unit is replaced; and a processing liquid auxiliary-supplying unit configured to supply a second processing liquid to the substrate,
wherein the computer-executable instructions cause the substrate processing apparatus to:
rotate the substrate by the substrate rotating unit;
supply the first processing liquid at a pre-determined supply flow rate to the substrate by the processing liquid supplying unit;
form a liquid film of the replacement liquid by supplying the replacement liquid to the substrate by the replacement liquid supplying unit; and form a liquid film of the second processing liquid by supplying the second processing liquid from the processing liquid auxiliary-supplying unit to a position on the substrate positioned at an outer peripheral side thereof than a supply position of the replacement liquid on the substrate while the replacement liquid is supplied to the substrate, wherein the second processing liquid is supplied at a flow rate which is smaller than the pre-determined supply flow rate of the first processing liquid.

* * * * *